United States Patent
Kim et al.

(10) Patent No.: US 6,552,587 B2
(45) Date of Patent: Apr. 22, 2003

(54) SYNCHRONOUS SEMICONDUCTOR DEVICE FOR ADJUSTING PHASE OFFSET IN A DELAY LOCKED LOOP

(75) Inventors: Se-Jun Kim, Kyoungki-do (KR); Jae-Kyung Wee, Kyoungki-do (KR); Yong-Jae Park, Kyoungki-do (KR)

(73) Assignee: Hynix Semiconductor Inc, Kyounki-do (KR)

( * ) Notice: Subject to any disclaimer, the term of this patent is extended or adjusted under 35 U.S.C. 154(b) by 0 days.

(21) Appl. No.: 10/033,004

(22) Filed: Dec. 28, 2001

(65) Prior Publication Data

US 2002/0097074 A1 Jul. 25, 2002

(30) Foreign Application Priority Data

Dec. 30, 2000 (KR) .......................... 2000-86612

(51) Int. Cl.[7] ................................. H03L 7/06
(52) U.S. Cl. ........................ 327/158; 327/525
(58) Field of Search ......................... 327/141, 147–150, 327/152–159, 161, 525; 365/96, 225.7; 331/DIG. 2; 375/376

(56) References Cited

U.S. PATENT DOCUMENTS

| | | | | |
|---|---|---|---|---|
| 5,585,754 A | * | 12/1996 | Yamashina et al. | 327/158 |
| 6,191,632 B1 | * | 2/2001 | Iwata et al. | 327/262 |
| 6,392,456 B1 | * | 5/2002 | Pyeon et al. | 327/147 |
| 6,426,900 B1 | * | 7/2002 | Maruyama et al. | 365/189.05 |

* cited by examiner

Primary Examiner—My-Trang Nuton
(74) Attorney, Agent, or Firm—Marshall, Gerstein & Borun

(57) ABSTRACT

A synchronous semiconductor device having a delay locked loop capable of adjusting phase offset between an external clock signal and an internal clock signal after a packaging process is completed is disclosed. The disclosed synchronous semiconductor device may include a replica delay for replicating delay time of an internal circuit and a delay controller for controlling the replicated delay time.

18 Claims, 7 Drawing Sheets

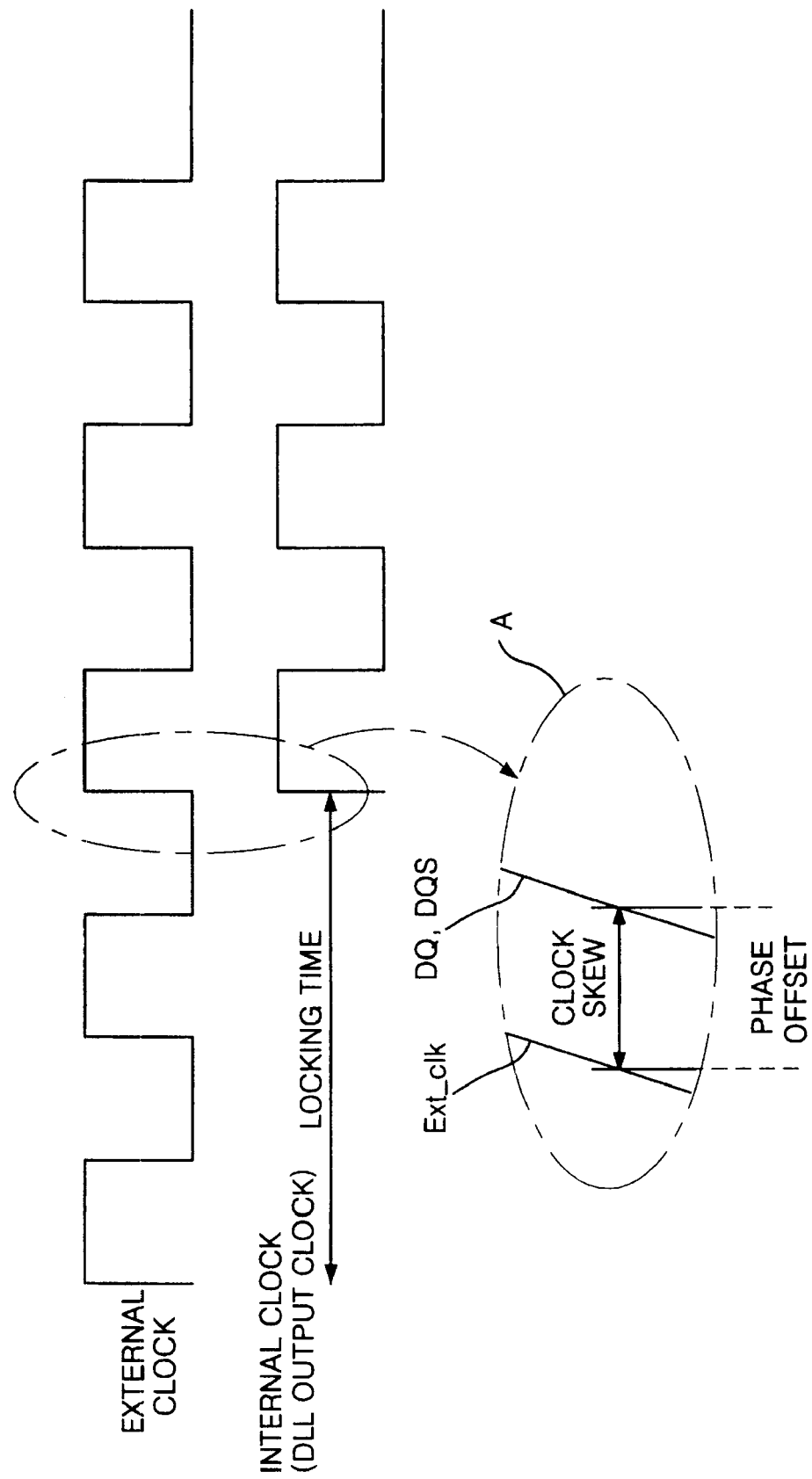

SYNCHRONOUS SEMICONDUCTOR DEVICE FOR ADJUSTING PHASE OFFSET IN A DELAY LOCKED LOOP

TECHNICAL FIELD

The present invention relates to semiconductor devices and, more particularly, to synchronous semiconductor memory devices having a delay locked loop (DLL).

DESCRIPTION OF RELATED ART

Because a synchronous semiconductor device operated in synchronization with an external clock generates an internal clock using a clock buffer and a clock driver, an internal clock within the synchronous semiconductor device is normally delayed as much as a predetermined delay time with respect to the external clock buffer. This delay decreases operating efficiency of the semiconductor device. In particular, the data access time (tAC) of the semiconductor device increases as much as the predetermined delay time due to the clock buffer or the like inside the chip. Accordingly, an internal clock generation circuit, which generates the internal clock synchronized with the external clock, is required inside the synchronous semiconductor device within the chip. At this time, a delay locked loop is used as the internal clock generation circuit to synchronize the internal and external clock signals.

Referring to FIG. 1, a conventional delay locked loop includes a clock buffer 10, a voltage controlled delay line 20, an output buffer 80, a data strobe signal output buffer 70, a replica delay 40, a phase detector 30, a charge pump 50 and a loop filter 60. In operation, the clock buffer 10 receives the external clock and the voltage controlled delay line 20 delays the output of the clock buffer 10 as much as the predetermined time. The data output buffer 80 outputs data outputted from a DRAM core according to the output of the voltage controlled delay line 20 and the data strobe signal output buffer 70 receives the output of the voltage controlled delay line 20 and outputs a data strobe signal.

The replica delay 40 monitors delay time of the clock buffer 10 and the data output buffer 80 and the phase detector 30 receives the output of the replica delay 40 and the output of the clock buffer 10 and compares phases thereof. The charge pump 50 and the loop filter 60 adjust the delay of the voltage controlled delay line 20 according to the output of the phase detector 30. The data output buffer 80 and the data strobe signal output buffer 70 are designed to have the same delay (Td).

Now, an operation of the delay locked loop will be described with reference to FIG. 1.

The external clock (ext_clk) is buffered in the clock buffer 10 and inputted into the phase detector 30 through the voltage controlled delay line 20 and the replica delay 40. The phase detector 30 compares the output of the clock buffer 10 with the output of the replica delay 40 and the charge pump 50 and the loop filter 60 adjust delay of the voltage controlled delay line 20 according to the comparison result in the phase detector 30. The above process is repeated so that two input values of the phase detector 30 are phase-locked. After the two input values of the phase detector 30 are phase-locked, the clock outputted from the voltage controlled delay line 20 is used as the internal clock synchronized with the external clock. The output buffer 80 outputs data according to the synchronized internal clock.

When considering a procedure by which the internal clock is synchronized with the external clock, a clock, which is as fast as and has a delay time generated by the clock buffer 10 and the data output buffer 80, is generated. The internal clock synchronized with the external clock is generated by the voltage controlled delay line 20 and passes to the data output buffer 80. Accordingly, the replica delay 40 is designed to have delay time identical to sum of the delay time (Ta) in the clock buffer 10 and the delay time (Td) in the data output buffer 80.

However, it is practically impossible that the delay time in the replica delay 40 is accurately accorded with the sum of the delay time (Ta) in the clock buffer 10 and the delay time (Td) in the data output buffer 80. Due to some problems of a process environment, such as pressure, voltage, temperature or the like and a package process, that the internal clock is not accurately synchronized with the external clock and has a fixed offset after phase locking.

Referring to FIG. 2, the internal clock is outputted with a fixed offset for the external clock. It is generally called as a clock skew. The clock skew is shown at 'A' denoted in FIG. 2. As mention the above, because the outputs of the clock buffer 10 and the data output buffer 80 and the outputs of the clock buffer replicated in the replica delay 40 and the data output buffer 80 are mismatched, clock skew is generated. Also, clock skew can be generated by a process environment or package. Accordingly, a process for adjusting the internal clock so that it is accurately synchronized with the external clock is required after manufacturing the semiconductor memory device.

Generally, there are two methods used to adjust delay time. A first method is to adjust delay time of the replica delay on a wafer and a second method is to adjust delay time of the replica delay after the semiconductor device is packaged.

FIG. 3A is block diagram illustrating a delay locked loop capable of adjusting delay time of the replica delay 40 on a wafer according to the prior art.

Referring to FIG. 3A, when adjusting delay time of the replica delay 40 on the wafer level, a fuse unit 41 is provided at the replica delay 40 and a phase offset of the internal clock synchronized with the external clock is measured after phase locking. The fuses are blown by a laser to adjust the replica delay 40 to be as much as the measured phase offset. At this time, expensive laser equipment is required to adjust blowing of fuse unit 41 and, even if the internal clock is synchronized with the external clock by minimizing the phase offset, the operation can be changed after the packaging process.

Referring to FIG. 3B, when adjusting delay time of the replica delay 40 after the package is completed, an anti-fuse unit 42 is equipped at the replica delay 40 and the anti-fuse is shorted as much as phase offset of the internal clock. At this time, high voltage is applied into a specific input pin and an insulator of the anti-fuse unit 42 breaks down so that the anti-fuse unit 42 is shorted. Accordingly, expensive laser equipment used for adjusting delay time at the wafer is not required and an error generated in the real operation is minimized because the adjustment of the phase offset is performed after the package is completed.

However, it is disadvantageous that the specific pin for applying the high voltage is used not at a real operation but just as delay time adjustment. Also, if the high voltage is applied from the exterior, it has a bad effect on reliability of other devices.

SUMMARY

In accordance with an aspect of the disclosed apparatus, there is provided a synchronous semiconductor device having a delay locked loop that may include a replica delay for replicating delay time of an internal circuit, an anti-fuse circuit for controlling the replicated delay time, and a voltage generator for applying voltage into the anti-fuse circuit.

In accordance with another aspect of the disclosed apparatus, there is provided a semiconductor device that may include a clock buffer for receiving an external clock signal and generating an internal clock signal, a delay line for delaying the internal clock signal for synchronization with the external clock signal, and an output buffer for receiving an output of the delay line and outputting the internal clock signal. The semiconductor device may also include a replica delay for receiving the output of the delay line, replicating delay time until the external clock signal is outputted as the internal clock signal and adjusting the replicated delay time and a phase detector for comparing the output phase of the replica delay with the output phase of the clock buffer. Further, the semiconductor device may include a phase control unit for controlling delay time of the delay line in response to an output signal of the phase detector, an anti-fuse circuit for outputting a control signal to adjust the replicated delay time and a voltage generator for applying voltage into the anti-fuse circuit.

BRIEF DESCRIPTION OF THE DRAWINGS

FIG. 2 a timing diagram showing the offset generation in the delay locked loop of FIG. 1;

DETAILED DESCRIPTION

Hereinafter, a synchronous semiconductor device for a high-speed operation having a delay locked loop capable of adjusting phase offset after a packaging process is completed is described in detail with reference to the accompanying drawings.

Figure 1:
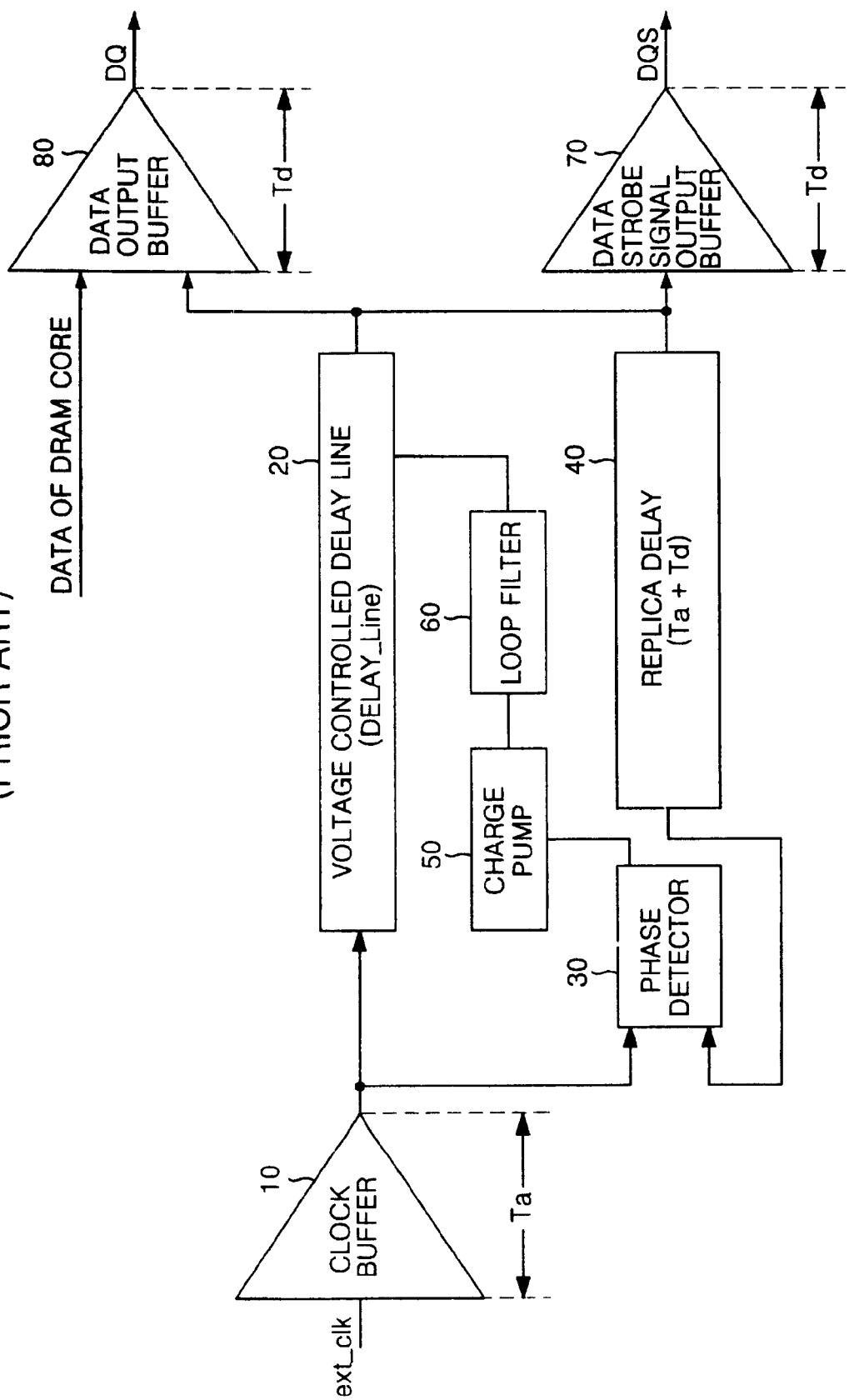
FIG. 1 is a block diagram illustrating a conventional delay locked loop (DLL)
Figure 3A:
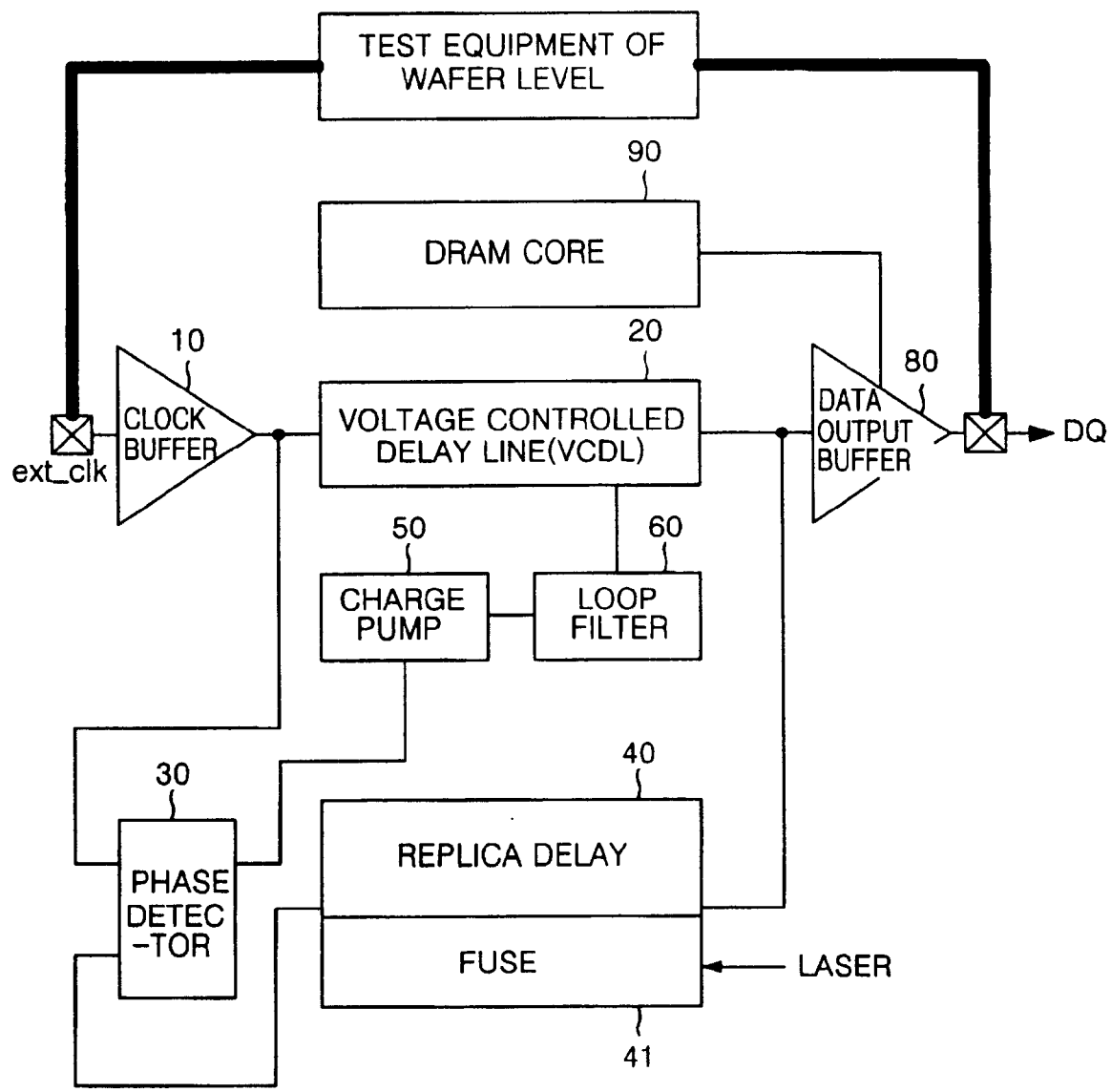
FIG. 3A is a block diagram illustrating a delay locked loop according to the prior art.
Figure 3B:
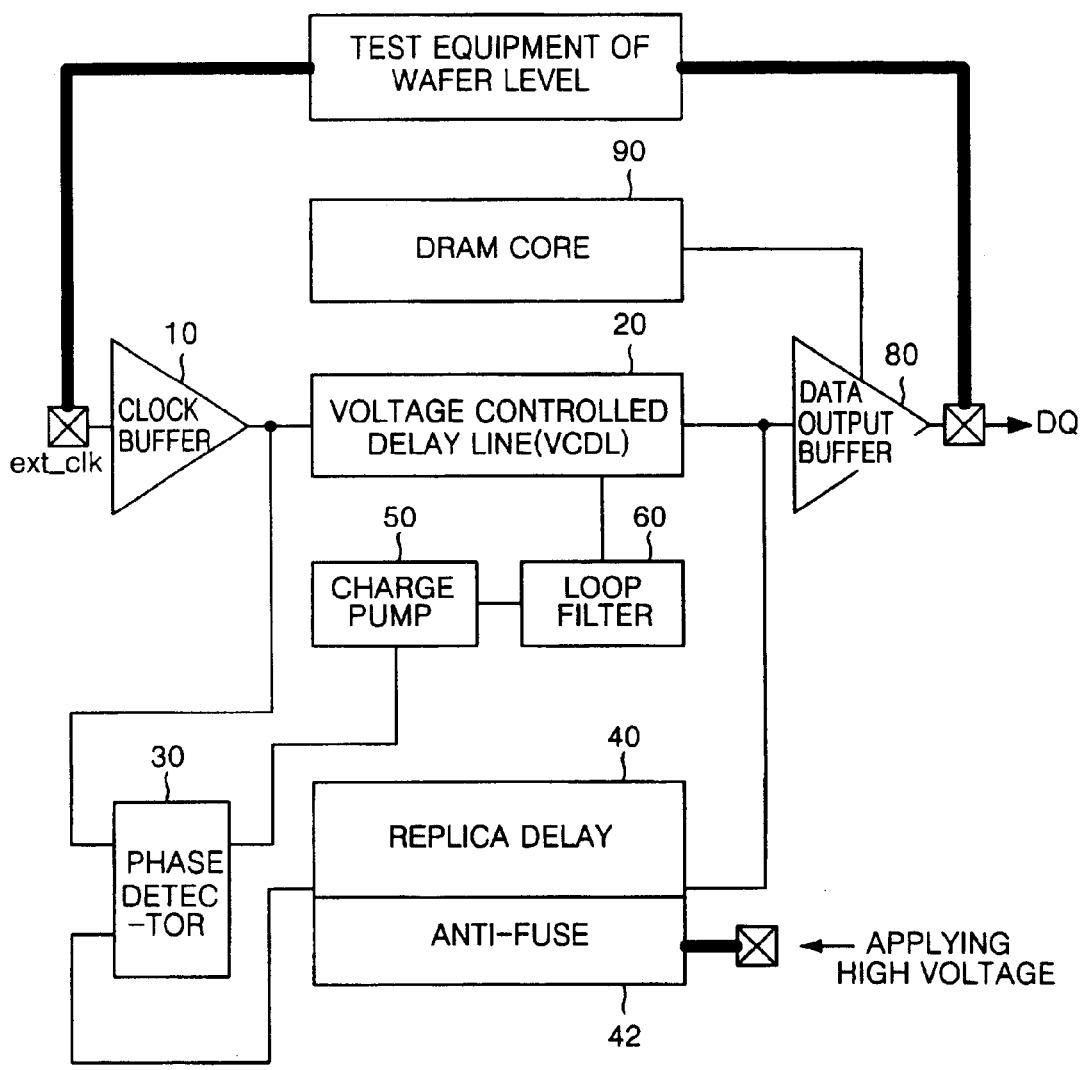
FIG. 3B is a block diagram illustrating a second delay locked loop according to the prior art.
Figure 4:
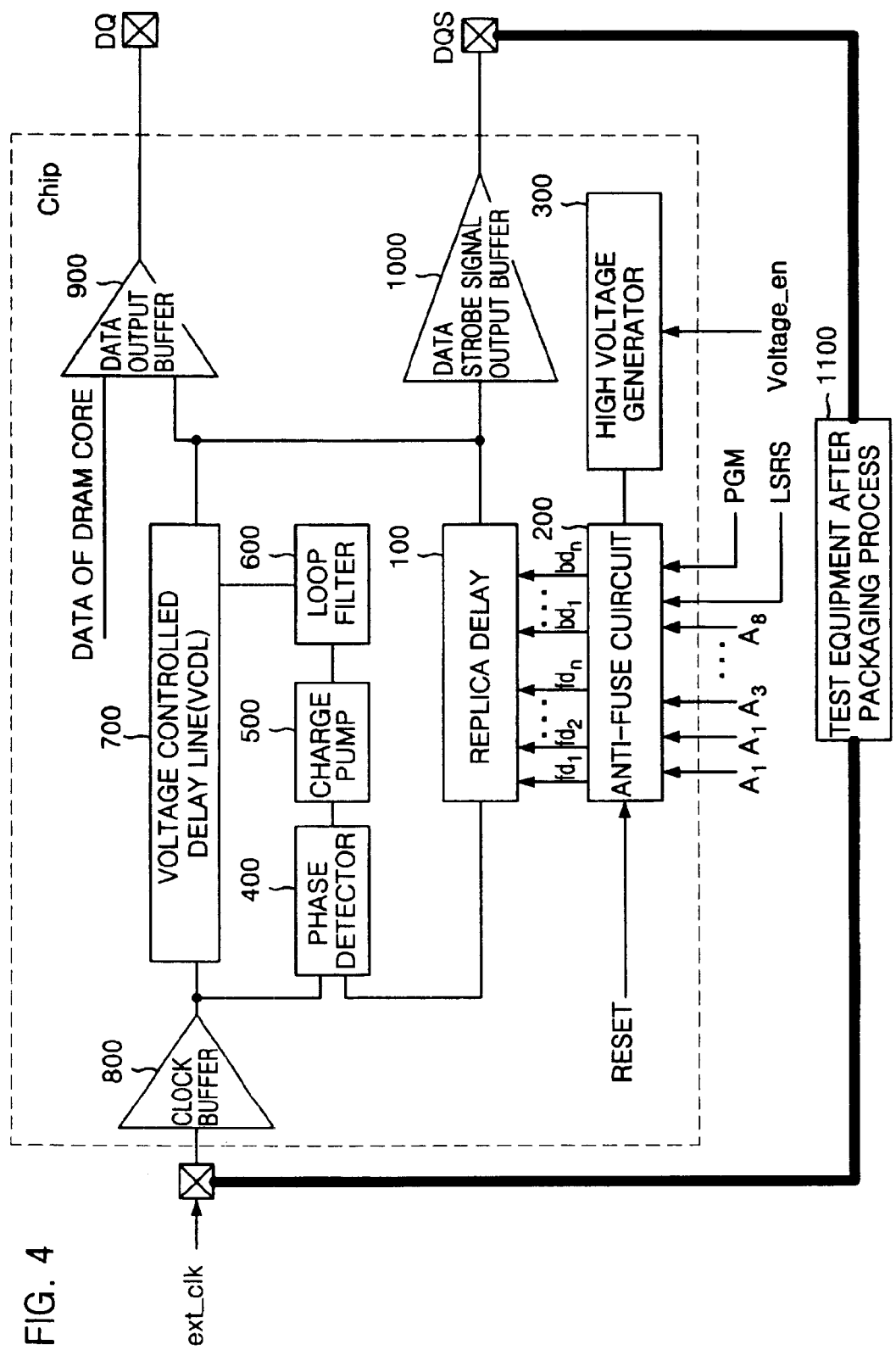
FIG. 4 is a block diagram illustrating a delay locked loop.

Referring to FIG. 4, the delay locked loop includes a clock buffer 800, a voltage controlled delay line (VCDL) 700, an output buffer 900, a data strobe signal output buffer 1000, a replica delay 100, a phase detector 400, a charge pump 500, a loop filter 600, an anti-fuse circuit 200 and a high voltage generator 300.

The clock buffer receives an external clock and buffers the external clock. The voltage controlled delay line 700 delays an output of the clock buffer as much as a predetermined time. The data output buffer 900 outputs data outputted from a DRAM core according to an internal clock synchronized with the external clock and the data strobe signal output buffer 1000 outputs a data strobe signal by receiving an output of the voltage controlled delay line 700. The replica delay 100 replicates delay time of the clock buffer 800 and the data output buffer 900 and adjusts delay time according to control signals (fd1 to fdn and bd1 to bdn).

The phase detector 400 receives outputs of the clock buffer 800 and the replica delay 100 and compares phases thereof. The charge pump 500 and the loop filter 600 adjust delay of the voltage controlled delay line 700 according to the output of the phase detector 400. The anti-fuse circuit 200 receives a plurality of address signals A1 to An and outputs a plurality of control signals fd1 to fdn and bd1 to bdn to adjust phase offset of the replica delay 100. The high voltage generator 300 applies high voltage into the anti-fuse circuit 200. Also, there is test equipment for measuring phase offset of the replica delay 100 after the packaging process is completed.

Figure 5:
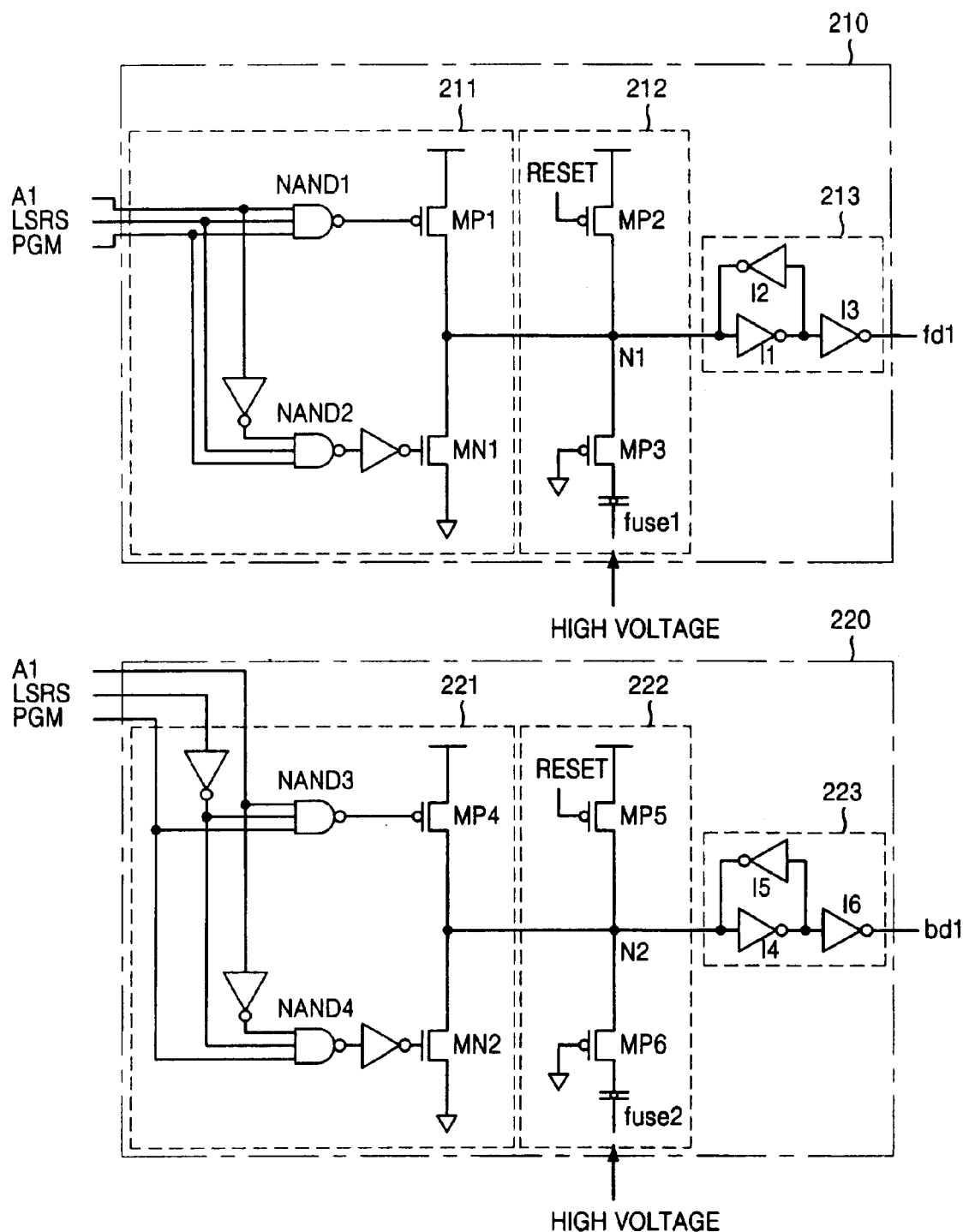
FIG. 5 is a circuit diagram illustrating an anti-fuse circuit in the delay locked loop.

FIG. 5 is a circuit diagram illustrating a circuit generating the control signals fd1 and bd1 in the anti-fuse circuit 200 of FIG. 4. The control signals are generated according to a signal inputted into the address signal A1.

Referring to FIG. 5, the circuit generating the control signals fd1 and bd1 includes a first control signal generating unit 210 and a second control signal generating unit 220. The first control signal generating unit 210 outputs a first control signal fd1 to increase delay time of the replica delay 100. The second control signal generating unit 220 outputs a second control signal bd1 to decrease delay time of the replica delay 100.

The first control signal generating unit 210 includes a first anti-fuse selection unit 211, a first anti-fuse unit 212 and a first output unit 213. The first anti-fuse selection unit 211 receives a signal inputted from the address A1 and outputs a selection signal determining whether the anti-fuse is used. The first anti-fuse unit 212 insulates or shorts the anti-fuse according to the outputs of the first anti-fuse selection unit 211. The first output unit 213 latches an output signal of the first anti-fuse unit 212 and outputs the first control signal fd1 of the replica delay 100.

The first anti-fuse selection unit 211 includes a first three-input NAND gate NAND1, a second three-input NAND gate NAND2, a first PMOS transistor MP1 and a first NMOS transistor MN1. The first NAND gate NAND1 receives the address signal A1 inputted from the external chip, an offset adjustment enable signal PGM and a selection control signal LSRS selecting whether an offset of the replica delay increases or decreases. The second NAND gate NAND2 receives an inversed signal of the address signal A1, the offset adjustment enable signal PGM and a selection control signal LSRS. The PMOS transistor MP1, which the output of the first NAND gate NAND1 is inputted into the gate thereof, connects power supply voltage with a first node N1 and the first NOMS transistor MN1, which the inversed output of the second NAND gate NAND2 is inputted into a gate thereof, connects ground with the first node N1.

The first anti-fuse unit 212 includes a second PMOS transistor MP2, a third PMOS transistor MP3 and a first fuse fuse1. The second PMOS transistor MP2, which a reset signal is inputted into a gate thereof, connects power supply voltage with the first node N1 and the third PMOS transistor MP3, which ground is connected to a gate thereof, connects the first node N1 with the first fuse fuse1. The first fuse fuse1 is connected to the third PMOS transistor MP3 and high voltage is applied thereto.

The first output unit 213 includes first and second inverters I1 and I2 to latch voltage of the first node N1 and a third inverter I3 for inverting and outputting output of the first inverter I1.

A second control signal generating unit 220 includes a second anti-fuse selection unit 221, a second anti-fuse unit 222 and a second output unit 223.

The second anti-fuse selection unit 221 receives a signal inputted from the address A1 and outputs a selection signal determining whether the anti-fuse is used. The second anti-fuse unit 221 insulates or shorts the anti-fuse according to the outputs of the second anti-fuse selection unit 221. The second output unit 223 latches an output signal of the second anti-fuse unit 222 and outputs the second control signal bd1 of the replica delay 100.

The second anti-fuse selection unit 221 includes a third three-input NAND gate NAND3, a fourth three-input NAND gate NAND4, a fourth PMOS transistor MP4 and a second NMOS transistor MN2. The third NAND gate NAND3 receives the address signal A1 inputted from the external chip, the offset adjustment enable signal PGM and an inversed signal of the selection control signal LSRS. The fourth NAND gate NAND4 receives an inversed signal of the address signal A1, the offset adjustment enable signal PGM and the inversed signal of the selection control signal LSRS. The fourth PMOS transistor MP4, which the output of the third NAND gate NAND3 is inputted into the gate thereof, connects power supply voltage with a second node N2 and the second NOMS transistor MN2, which the inversed output of the fourth NAND gate NAND4 is inputted into a gate thereof, connects ground with the second node N2.

The second anti-fuse unit 222 includes a fifth PMOS transistor MP5, a sixth PMOS transistor MP6 and a second fuse fuse2. The fifth PMOS transistor MP5, which receives a reset signal at the gate thereof, connects power supply voltage with the second node N2 and the sixth PMOS transistor MP6, which has ground connected to the gate thereof, connects the second node N2 with the second fuse fuse2. The second fuse fuse2 is connected to the sixth PMOS transistor MP6 having a high voltage applied thereto.

The second output unit 223 includes fourth and fifth inverters I4 and I5 to latch voltage of the second node N2 and a sixth inverter I6 for inverting and outputting the output of the fourth inverter I4.

Figure 6:
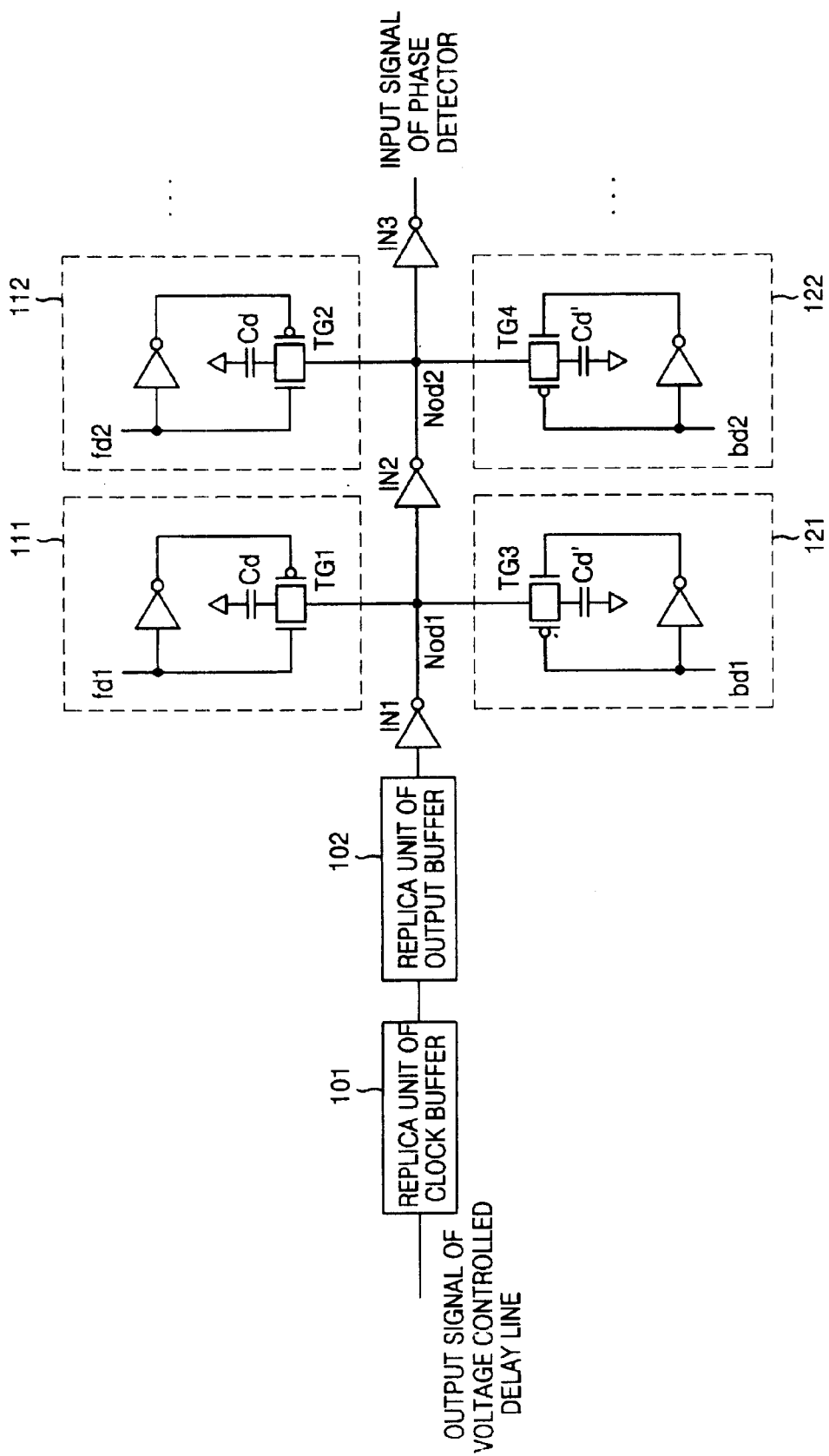
FIG. 6 is a circuit diagram illustrating a replica delay of FIG. 4.

Referring to FIG. 6, the replica delay 100 includes a clock buffer replica unit 101, an output buffer replica unit 102, a plurality of inverters (IN1, IN2, IN3), a first plurality of unit delay units 111, 112 and a second plurality of unit delay units 121, 122.

The clock buffer replica unit 101 replicates the clock buffer 800 and the output clock buffer replica unit 102 replicates the data output buffer 900. The inverters IN1, IN2, which are connected in series, receive an output of the output buffer replica unit 102. The first plurality of unit delay units 111, 112 increase delay time of the replica delay 100 according to a plurality of control signals fd1, fd2 and the second plurality of unit delay units 121, 122 decrease of delay time of the replica delay 10 according to a plurality of control signals bd1, bd2.

The first delay unit 111 includes a first unit delay capacitor Cd the size of which is determined by a first unit delay time, and a first transmission gate TG1 connecting the first unit delay capacitor Cd and a node Nod1 according to the first control signal fd1. The second delay unit 121 includes a second unit delay capacitor Cd' sized according to a second unit delay time and a second transmission gate TG2 connecting the second unit delay capacitor Cd' and a node Nod1 according to the first control signal bd1.

Referring to FIGS. 4 to 6, an operation to adjust delay time of the replica equipped in the delay locked loop after the packaging process is described in detail.

After the packaging process is completed, the offset enable signal PGM is enabled for connecting the plurality of address signals (A1, A2, An) with the anti-fuse circuit 200 and the reset signal is applied to the anti-fuse circuit 200. The plurality of address input units A1, A2, An, which are a plurality of address pins for inputting addresses in the memory device, are temporarily used when delay time of the replica delay 100 is adjusted.

The delay locked loop is operated to be a phase locked state and a phase offset between the external clock and the internal clock is measured. Specific digital signals are applied to the anti-fuse circuit 200 through the plurality of address pins according to the measured phase offset. The anti-fuse circuit 200 generates and outputs the first and second control signals fd1 to fdn and bd1 to bdn into the replica delay 100 according to the specific digital signals inputted into the anti-fuse circuit 200. The replica delay 100 outputs increased or decreased signals as much as predetermined delay time into the phase detector 400 according to the first and second control signals fd1 to fdn and bd1 to bdn.

Now, for example, a generation process of the first and second control signals fd1 and bd1 will be described.

When the offset adjustment enable signal PGM and the inversed of the selection control signal LSRS are inputted in a logic 'high' level, if the address A1 signal is inputted in a logic 'high' level, the output signal of the first NAND gate NAND1 becomes a logic 'low' level and the output signal of the second NAND gate NAND2 becomes a logic 'high' so that the first PMOS transistor is tuned on and the first node N1 becomes a logic 'high' level. Accordingly, the first output unit 213 outputs the first control signal fd1 of a logic 'high' level into the replica delay 100 in FIG. 5. Subsequently, the first transmission gate TG1 in the first unit delay unit 111 is turned on in response to the first control signal fd1 of the logic 'high' level so that the first unit delay capacitor Cd is connected with the node Nod1 and the delay time of the replica delay is increased as much as the first unit delay time.

When the selection control signal LSRS is transitions to a logic 'low' level, the third NAND gate NAND3 outputs a signal of a logic 'low' level so that the fourth PMOS transistor MP4 is turned on and the second node N2 becomes a logic 'high' level. Accordingly, the second control signal bd1 of a logic 'high' level is inputted into the replica delay 100. Because the second control signal bd1 of a logic 'high' level is applied, the capacitor Cd' of the second unit delay unit 121 is disconnected with the node Nod1 so that the delay time of the replica delay 100 is decreased.

Subsequently, the phase offset between the external clock signal and the internal clock signal is measured again and the specific digital signal is inputted into the addresses A1 to An pins again according to the measure phase offset. As the above process is repeatedly performed, the specific digital signal capable of minimizing the phase offset between the external clock signal and the internal clock signal can be acquired.

When the acquired digital signal is applied into address A1 to An pins and an enable signal (voltage_en) of the high voltage generator 300 equipped in the delay locked loop is enabled, high voltage is applied to the anti-fuse circuit 200 and an anti-fuse of the control signal generating unit, which the digital signal is applied among the plurality of the control signal generating units (210, 220) is shorted. If the enable signal (voltage_en) of the high voltage generator 300 is disabled, the anti-fuse is connected to ground.

The first unit delay units (111, 112) play the role of increasing delay time of the replica delay 100 and the second unit delay units (121, 122) play the role of decreasing delay time of the replica delay 100. Also, the first and second unit delay units can be used to increase or decrease delay time of the replica delay 100. The size of capacitors Cd and Cd' in the first and second unit delay units is determined by a characteristic of the semiconductor memory device.

Hereinafter, shorting processes of the anti-fuses fuse1 and fuse2 in the anti-fuse circuit 200 will be described.

Because power supply voltage (for example, 3.3V) is induced at the first node N1 by the control signals A1, LSRS and PGM and the third PMOS transistor MP3 has already turned on, if high voltage (for example, −5V) is applied to one terminal of the first fuse fuse1, a voltage difference between both terminals of the first fuse fuse1 becomes about 8V so that an insulator of the first fuse fuse1 is broken, that is, the both terminals of the first fuse fuse1 are shorted.

If the power supply voltage is not applied to one terminal of the first fuse fuse1, a voltage difference between the both terminals of the first fuse fuse1 is about −5V even if the high voltage is applied so that the insulator is not broken. Namely, if the power supply voltage is induced to one terminal of the fuse, the fuse is broken and, if ground is induced, the fuse is not broken.

Accordingly, as the delay time of the delay locked loop is adjusted according to the above processes, the internal clock signal, which the phase offset is nearly removed by accurately synchronized with the external clock signal, can be acquired. The general address pin can be used instead of the specific external pin and the delay time of the replica delay can be adjusted without use of an expensive laser equipment so that the phase offset of the delay locked loop can be efficiently minimized.

The disclosed technique and apparatus can adjust delay time of the replica delay equipped in the delay locked loop not only after the package process is completed, but also after a module is mounted. Also, the disclosed technique and apparatus can adjust delay time of the replica delay used in a register delay locked loop.

Accordingly, as the delay time of the replica delay equipped in the delay locked loop is efficiently adjusted after a packaging process according to the present invention, an efficiency of the synchronous semiconductor device can be improved.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A synchronous semiconductor device having a delay locked loop, comprising:
    a replica delay for replicating a delay time of an internal circuit; and
    a delay controller comprising an anti-fuse circuit for controlling the replicated delay time, the anti-fuse circuit comprising a first control signal generating unit for outputting a first control signal to the replica delay to increase the replicated delay time; and
    a second control signal generating unit for outputting a second control signal to the replica delay to decrease the replicated delay time.

2. The synchronous semiconductor device as recited in claim 1, further comprising a voltage generator for applying voltage to the delay controller.

3. The synchronous semiconductor device as recited in claim 1, wherein the first control signal generating unit comprises:
    an anti-fuse selection unit for outputting a signal determining whether the anti-fuse is shorted by combining an offset adjustment signal inputted through an address pin, an enable signal for an offset mode and a selection signal determining whether the replicated delay time is increased or decreased;
    an anti-fuse unit for insulating or shorting the anti-fuse according to an output signal of the anti-fuse selection unit; and
    a first latch for outputting a first control signal by latching the output signal of the anti-fuse unit.

4. The synchronous semiconductor device as recited in claim 3, wherein the anti fuse-selection unit comprises:
    a first NAND gate receiving the offset adjustment signal, the enable signal and the selection signal;
    a second NAND gate receiving an inversed offset adjustment signal, the enable signal and the selection signal;
    a first switch for outputting power supply voltage in response to an output signal of the first NAND gate; and
    a second switch for outputting ground voltage in response to an output signal of the second NAND gate.

5. The synchronous semiconductor device as recited in claim 4, wherein the anti-fuse unit comprises:
    a third switch for applying power supply voltage in repose to a reset signal; and
    an anti-fuse, which is connected to an output terminal of the anti-fuse selection unit and voltage is applied from the voltage generator, to be shorted when a predetermined voltage difference is generated.

6. The synchronous semiconductor device as recited in claim 5, wherein the first latch comprises fourth and fifth inverters for latching voltage of the output terminal of the anti-fuse selection unit.

7. The synchronous semiconductor device as recited in claim 1, wherein the replica delay comprises:
    a clock buffer replica unit for replicating a clock buffer by receiving an external clock signal;
    a data output buffer replica unit for receiving an output of the clock buffer replica unit and replicating a data output buffer;
    a plurality of buffers, which are connected in series, for buffering an output of the data output buffer replica unit;
    a plurality of first unit delay units, which are connected to each output terminal of the plurality of buffers, for delaying the output of the replica delay as much as a first unit delay time in response to the first control signal; and
    a plurality of second unit delay units, which are connected to each output terminal of the plurality of buffers, for forwarding the output of the replica delay as much as a second unit delay time in response to the second control signal.

8. The synchronous semiconductor device as recited in claim 7, wherein each of the first unit delay units comprises:
    a first capacitor capable of delaying delay time as much as the first unit delay time; and
    a first transfer gate for connecting the first capacitor with the output terminal of the buffers.

9. The synchronous semiconductor device as recited in claim 8, wherein each of the second unit delay units comprises:
    a second capacitor capable of delaying delay time as much as the second unit delay time; and a second transfer gate for connecting the second capacitor with the output terminal of the buffers.

10. A synchronous semiconductor device comprising:

a clock buffer for receiving an external clock signal and generating an internal clock signal;

a delay line for delaying the internal clock signal for synchronization with the external clock signal;

a data output buffer for receiving an output of the delay line and outputting the internal clock signal received from the delay line;

a replica delay for receiving the output of the delay line, replicating delay time until the external clock signal is outputted as the internal clock signal and adjusting the replicated delay time;

a phase detector for comparing the output phase of the replica delay with the output phase of the clock buffer;

a phase control unit for controlling delay time of the delay line in response to an output signal of the phase detector, a delay controller comprising an anti-fuse circuit for outputting a control signal to adjust the replicated delay time;

the anti-fuse circuit comprising a first control signal generator for outputting a first control signal to the replica delay to increase the replicated delay time;

a second control signal generator for outputting a second control signal to the replica delay to decrease the replicated delay time; and a voltage generator for applying voltage to the anti-fuse circuit.

11. The synchronous semiconductor device as recited in claim 10, wherein the phase control unit comprises:

a charge pump for receiving the output of the phase detector and providing charge; and a loop filter for adjusting delay time of the delay line according to the charge inputted from the charge pump.

12. The synchronous semiconductor device as recited in claim 10, wherein the first control signal generator comprises:

an anti-fuse selection unit for outputting a signal determining whether an anti-fuse is shorted by combining an offset adjustment signal inputted through an address pin, an enable signal for an offset mode and a selection signal determining whether the replicated delay time is increased or decreased;

an anti-fuse unit for insulating or shorting the anti-fuse according to an output signal of the anti-fuse selection unit; and a latch for outputting a first control signal by latching the output signal of the anti-fuse unit.

13. The synchronous semiconductor device as recited in claim 12, wherein the anti-fuse selection unit comprises:

a first NAND gate receiving the offset adjustment signal, the enable signal and the selection signal;

a second NAND gate receiving an inversed offset adjustment signal, the enable signal and the selection signal;

a first switch for outputting power supply voltage in response to an output signal of the first NAND gate; and a second switch for outputting ground voltage in response to an output signal of the second NAND gate.

14. The synchronous semiconductor device as recited in claim 13, wherein the anti-fuse unit comprises:

a third switch for applying power supply voltage in response to a reset signal; and an anti-fuse, which is connected to an output terminal of the anti-fuse selection unit and voltage is applied from the voltage generator, to be shorted when a predetermined voltage difference is generated.

15. The synchronous semiconductor device as recited in claim 14, wherein the latch comprises fourth and fifth inverters for latching voltage of the output terminal of the anti-fuse selection unit.

16. The synchronous semiconductor device as recited in claim 10, wherein the replica delay comprises:

a clock buffer replica unit for replicating a clock buffer by receiving an external clock signal;

a data output buffer replica unit for receiving an output of the clock buffer replica unit and replicating a data output buffer;

a plurality of buffers, which are connected in series, for buffering an output of the data output buffer replica unit;

a plurality of first unit delay units, which are connected to each output terminal of the plurality of buffers, for delaying the output of the replica delay as much as a first unit delay time in response to the first control signal; and a plurality of second unit delay units, which are connected to each output terminal of the plurality of buffers, for forwarding the output of the replica delay as much as a second unit delay time in response to the second control signal.

17. The synchronous semiconductor device as recited in claim 16, wherein each of the first unit delay units comprises:

a first capacitor capable of delaying delay time as much as the first unit delay time; and a first transfer gate for connecting the first capacitor with the output terminal of the buffers.

18. The synchronous semiconductor device as recited in claim 17, wherein each of the second unit delay units comprises:

a second capacitor capable of delaying delay time as much as the second unit delay time; and a second transfer gate for connecting the second capacitor with the output terminal of the buffers.

* * * * *